United States Patent
Boehm et al.

(10) Patent No.: US 9,159,397 B2
(45) Date of Patent: Oct. 13, 2015

(54) METHODS AND APPARATUSES FOR REFRESHING MEMORY

(71) Applicant: Micron Technology, Inc., Boise, ID (US)

(72) Inventors: Aaron P. Boehm, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 360 days.

(21) Appl. No.: 13/693,865

(22) Filed: Dec. 4, 2012

(65) Prior Publication Data

US 2014/0153350 A1    Jun. 5, 2014

(51) Int. Cl.
*G11C 7/00* (2006.01)
*G11C 11/406* (2006.01)

(52) U.S. Cl.
CPC ........ *G11C 11/40615* (2013.01); *G11C 11/406* (2013.01); *G11C 11/40607* (2013.01); *G11C 11/40611* (2013.01); *G11C 7/00* (2013.01)

(58) Field of Classification Search
CPC .. G11C 7/00; G11C 11/406; G11C 11/40615; G11C 11/40611; G11C 11/40607

USPC ................................................. 365/222, 236
See application file for complete search history.

(56) References Cited

U.S. PATENT DOCUMENTS

| | | | |
|---|---|---|---|
| 5,255,381 A | 10/1993 | Chinnaswamy et al. | |
| 5,717,644 A | 2/1998 | Hadderman et al. | |
| 7,869,300 B2 | 1/2011 | Bhakta et al. | |
| 2003/0067824 A1* | 4/2003 | Janzen | 365/222 |
| 2004/0196718 A1* | 10/2004 | Poechmueller | 365/222 |
| 2006/0236027 A1 | 10/2006 | Jain et al. | |
| 2006/0245288 A1* | 11/2006 | Hokenmaier | 365/222 |
| 2006/0268643 A1* | 11/2006 | Schreck et al. | 365/222 |
| 2009/0141576 A1* | 6/2009 | Ruckerbauer | 365/222 |

* cited by examiner

*Primary Examiner* — Toan Le
(74) *Attorney, Agent, or Firm* — Dorsey & Whitney LLP

(57) ABSTRACT

Apparatuses and methods for memory refreshing memory cells is described. An example method includes receiving a self refresh command at a memory. The method further includes refreshing the memory at a first refresh rate after receiving the self refresh command. The method further includes refreshing the memory at a second refresh rate in response to a determination that each memory cell of the memory has been refreshed at the first refresh rate. The first refresh rate is greater than a second refresh rate.

21 Claims, 6 Drawing Sheets

METHODS AND APPARATUSES FOR REFRESHING MEMORY

TECHNICAL FIELD

Embodiments of the invention relate generally to electronic memories, and more particularly, in one or more of the illustrated embodiments, to refreshing memory cells in a memory.

DESCRIPTION OF RELATED ART

Advances in technology have resulted in high density memory architecture. High density memories become more susceptible to changes in state caused by external changes in power. Some memory cells require continuous refreshing to ensure a stored state is maintained in each memory cell. The memory refresh function may be controlled by an external system during use or by the memory device itself during idle periods. A transition from an externally controlled refresh to a self refresh, and vise versa, may result in period of instability in memory cells. During the period of instability, memory cells having physical characteristics requiring on-time refreshes may lose information if not timely refreshed, thus reducing reliability of the memory device.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
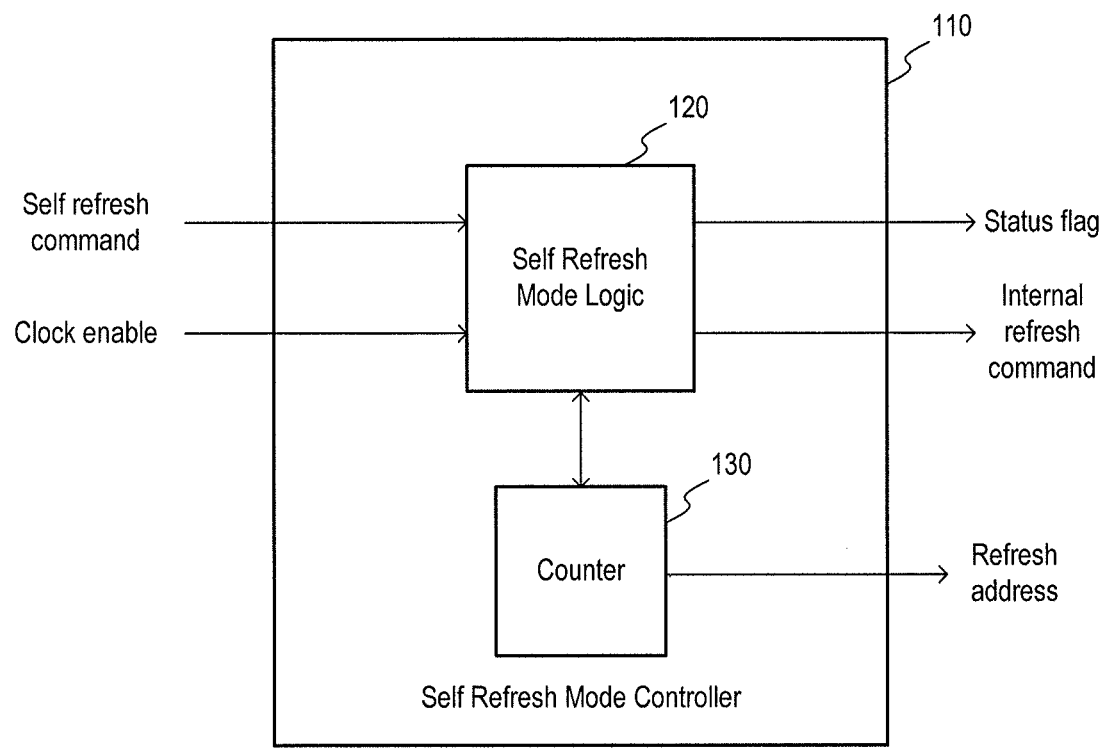
FIG. 1 is a block diagram of a particular illustrative embodiment of an apparatus including a self refresh mode controller.

Referring to FIG. 1, a particular illustrative embodiment of an apparatus (e.g., an integrated circuit, a memory device, a memory system, an electronic device or system, a smart phone, a tablet, a computer, a server, etc.) including a self refresh mode controller is disclosed and generally designated 100. The apparatus 100 may provide variable self refresh rates during self refresh. The apparatus 100 may include a self refresh mode controller 110 that includes a self refresh mode logic 120 and a counter 130.

In operation, the self refresh mode logic 120 may receive a self refresh command from an external controller (not shown). Based on the self refresh command, the self refresh mode logic 120 may enter a self refresh mode. While in the self refresh mode, the self refresh mode logic 120 may provide internal refresh commands to refresh the memory. In some memories, such a dynamic random access memory (DRAM), refreshing of memory cells is necessary to maintain data stored by each memory cell. The counter 130 may be configured to provide a refresh address count that may be used to refresh the memory. For example, the refresh address count may be provided as the refresh address for refreshing. The counter 130 may provide refresh addresses to be refreshed by changing (e.g., using a down counter) the refresh address count. As a result, the refreshing progresses through the memory as the refresh address count changes.

The self refresh mode logic 120 may also set a self refresh rate that controls a frequency at which the memory are refreshed. For example, the self refresh mode logic 120 may provide the refresh commands to refresh memory at a first refresh rate during a first time period while in self refresh mode. Further, the self refresh mode logic 120 may provide the internal refresh commands to refresh memory at a second refresh rate during a second time period while in self refresh mode. In some embodiments, the self refresh mode logic 120 provides (e.g., issues) refresh commands at the first refresh rate to refresh the memory at the first refresh rate, and provides refresh commands at the second refresh rate to refresh the memory at the second refresh rate. The self refresh rate may be controlled by the self refresh logic 120 in other manners as well.

The self refresh mode logic 120 may also be configured to receive a clock enable signal. In an embodiment, the external controller may provide, to the self refresh mode logic 120, the clock enable signal having a de-asserted value contemporaneously with the self refresh command. In an embodiment, the external controller may provide the clock enable signal having an asserted value to disable the self refresh mode, and reverts back to the externally controlled refresh mode. Further, the self refresh mode logic 120 may set a self refresh status flag that indicates when the self refresh mode logic 120 is refreshing memory at the first refresh rate. The self refresh status flag may be cleared by the self refresh mode logic 120 responsive to (e.g., upon, when, based on, etc.) the self refresh mode logic 120 switching to refreshing memory at the second refresh rate.

The first refresh rate and the second refresh rate may be determined by the self refresh mode logic 120. In an embodiment of the invention, the second refresh rate is a normal self refresh rate. The first refresh rate may be greater than the second refresh rate. In an embodiment, the first refresh rate is determined based on a multiplier applied to the second refresh rate. In a particular embodiment, the first refresh rate is twice as great as the second refresh rate. During a transition from an externally controlled refresh to a self refresh, a potential instability period may exist. For example, in order to conserve power, a voltage level of a power source to a memory device may be reduced. During this period of instability, memory cells having certain physical characteristics may make the memory cells susceptible to losing data. To mitigate the potential loss of data during the period of instability, the self refresh mode logic 120 may perform at least one complete refresh cycle at a higher frequency rate than a normal self refresh rate. It will be understood by those of ordinary skill in the art that the refresh may occur at the higher frequency rate for more or less than a complete refresh cycle. The higher frequency rate may be any multiplier of the normal refresh rate. In a particular embodiment, a multiplier associated with the higher frequency rate is selectable. The normal refresh rate may vary based on physical properties such as temperature, input power voltage, etc.

The self refresh mode logic 120 may determine when to switch from the first refresh rate to the second refresh rate in response to (e.g., based on) a count provided by the counter 130. In an embodiment, when the self refresh mode logic 120 receives the self refresh command, the self refresh mode logic 120 sets the self refresh status flag to indicate refreshing the memory at the first refresh rate and provides refresh commands to refresh the memory at the first refresh rate. The self refresh mode logic 120 may also store a current refresh address count of the counter 130 as an initial refresh address count. As the counter 130 increments the refresh address count during refresh, the self refresh mode logic 120 may compare each current refresh address count of the counter 130 with the initial refresh address count. Once the current refresh address count of the counter 130 matches the initial refresh address count, which indicates the completion of a refresh cycle of the memory in which all of the memory has been refreshed, the self refresh mode logic 120 may switch to the second refresh rate. The self refresh mode logic 120 may clear the refresh status flag to indicate that the memory is being refreshed at the second refresh rate. In an embodiment, the self refresh mode logic 120 may maintain the second refresh rate until receiving a self refresh disable command or a clock enable signal to exit self refresh mode.

In another embodiment, the counter 130 further provides additional bits of the count that may be used to ensure that the memory has been refreshed. For example, the counter 130 may provide two additional bits added as the two most significant bits (MSBs) of the refresh address count. In operation, when the self refresh mode logic 120 receives the self refresh command, the self refresh mode logic 120 enters a self refresh mode, sets the self refresh status flag to indicate refresh at the first refresh rate, and provides internal refresh commands to refresh the memory. The self refresh mode logic 120 may also reset the additional bits to zero responsive to receipt of the self refresh command. As explained above, the count may provide refresh addresses for refresh, incrementing a refresh address count as the refresh progresses. As the refresh address count rolls over from all ones to all zeroes, a first one of the MSBs changes from a zero to a one. As the refresh address count bits roll over from all ones to all zeroes a second time, the first one of the MSBs changes from one back to zero, and a second one of the MSBs changes from a zero to a one. In an embodiment, the self refresh mode logic 120 may monitor the additional counter bits of the counter 130 to determine when to switch to the second refresh rate. For example, the self refresh mode logic 120 may switch to the second refresh rate responsive to the second one of the MSBs having a particular value (e.g., changing to be a one). By monitoring the second one of the MSBs, the self refresh mode logic 120 may determine that at least one refresh cycle has been completed, which ensures that all of the memory has been refreshed since receiving the self refresh command. It will be apparent to those of ordinary skill in the art that the self refresh mode logic 120 may monitor a bit or bits other than the second one of the MSBs to determine whether to clear the self refresh flag. Based on the value of the second one of the MSBs, the self refresh mode logic 120 clears the self refresh status flag to indicate refresh at the second refresh rate, and switches to refreshing the memory at the second refresh rate.

In another embodiment, the self refresh mode logic 120 may operate in a similar manner as described above, but may monitor a decrementing counter rather than an incrementing counter. For example, the self refresh mode logic 120 stores a current refresh address count of the counter 130 as an initial refresh address count, and, as the counter 130 decrements the refresh address count during refresh, the self refresh mode logic 120 compares each current refresh address count of the counter 130 with the initial refresh address count. In an embodiment where the counter 130 further provides the additional bits, the self refresh mode logic 120 can monitor one or more of the additional bits to detect the one or more of the additional bits rolling from a one to a zero as the counter 130 decrements. Further, the self refresh mode logic 120 may reset each of the additional bits to a one responsive to receipt of the self refresh command.

Figure 2:
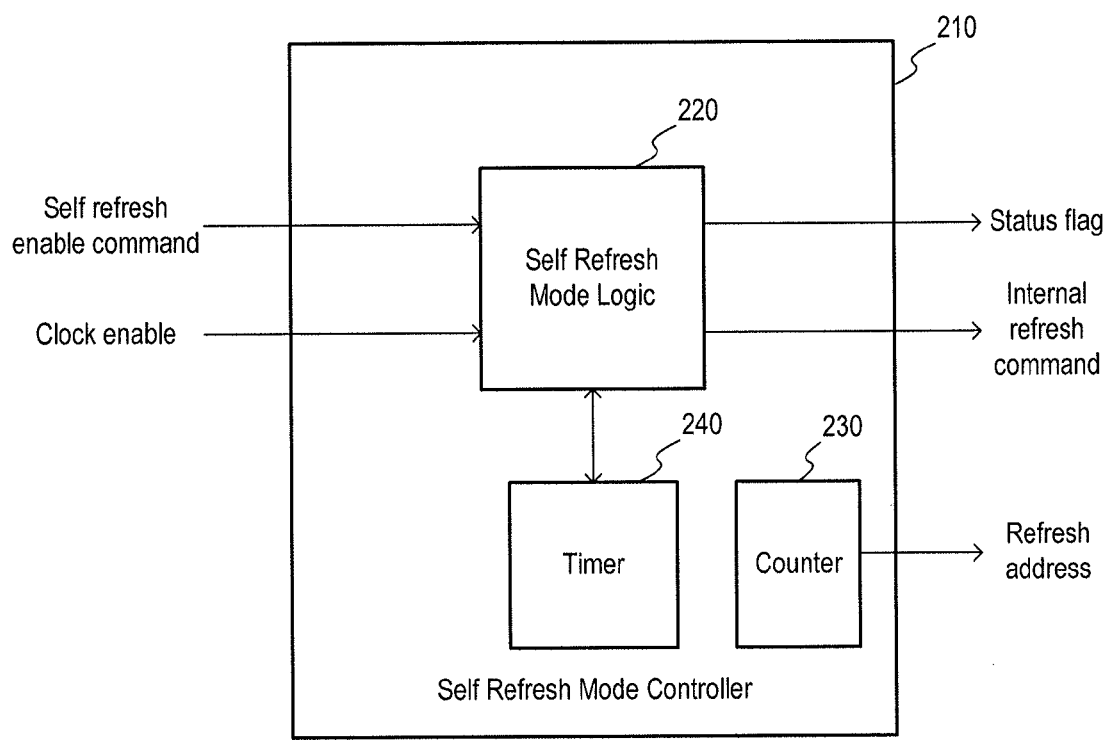
FIG. 2 is a block diagram of a particular illustrative embodiment of an apparatus including a self refresh mode controller.

Referring to FIG. 2, a particular illustrative embodiment of an apparatus (e.g., an integrated circuit, a memory device, a memory system, an electronic device or system, a smart phone, a tablet, a computer, a server, etc.) including a self refresh mode controller is disclosed and generally designated 200. The apparatus 200 may provide variable self refresh rates during self refresh. The apparatus 200 may include a self refresh mode controller 210 that includes a self refresh mode logic 220 and a timer 240. The timer 240 may be used to begin a time period. The self refresh mode logic 220 may be the self refresh mode logic 120 of FIG. 1.

In operation, the self refresh mode logic 220 may receive a self refresh command from an external controller (not shown). Based on the self refresh command, the self refresh mode logic 220 may enter a self refresh mode and provide internal refresh commands to refresh a memory. The self refresh mode logic 220 may provide the internal refresh commands to refresh memory at a first refresh rate during a first time period while in self refresh mode. Further, the self refresh mode logic 220 may provide the internal refresh commands to refresh memory at a second refresh rate during a second time period while in self refresh mode. The first refresh rate may be greater than the second refresh rate.

The self refresh mode logic 220 may determine when to switch from the first refresh rate to the second refresh rate based on the timer 240. For example, responsive to the self refresh mode logic 220 receiving the self refresh command, the self refresh mode logic 220 may activate the timer 240 to begin a time period. As explained above, the self refresh mode logic 220 provides internal refresh commands to refresh the memory at the first refresh rate. The self refresh mode logic 220 may monitor the timer 240, and responsive to the time period expiring, the self refresh mode logic 220 may switch to providing the internal refresh commands to refresh the memory at the second refresh rate.

Similar to the self refresh mode logic 120 of FIG. 1, the self refresh mode logic 220 may also be configured to receive a clock enable signal. In an embodiment, the external controller may provide, to the self refresh mode logic 220, the clock enable signal having a de-asserted value contemporaneously with the self refresh command. In an embodiment, the external controller may provide the clock enable signal having an asserted value to disable the self refresh mode, and reverts back to the externally controlled refresh mode. Also similar to the self refresh mode logic 120 of FIG. 1, the self refresh mode logic 220 may set a self refresh status flag that indicates when the self refresh mode logic 220 is refreshing memory at the first refresh rate. The self refresh status flag may be cleared by the self refresh mode logic 220 responsive to the self refresh mode logic 220 switching to refreshing memory at the second refresh rate.

Figure 3:
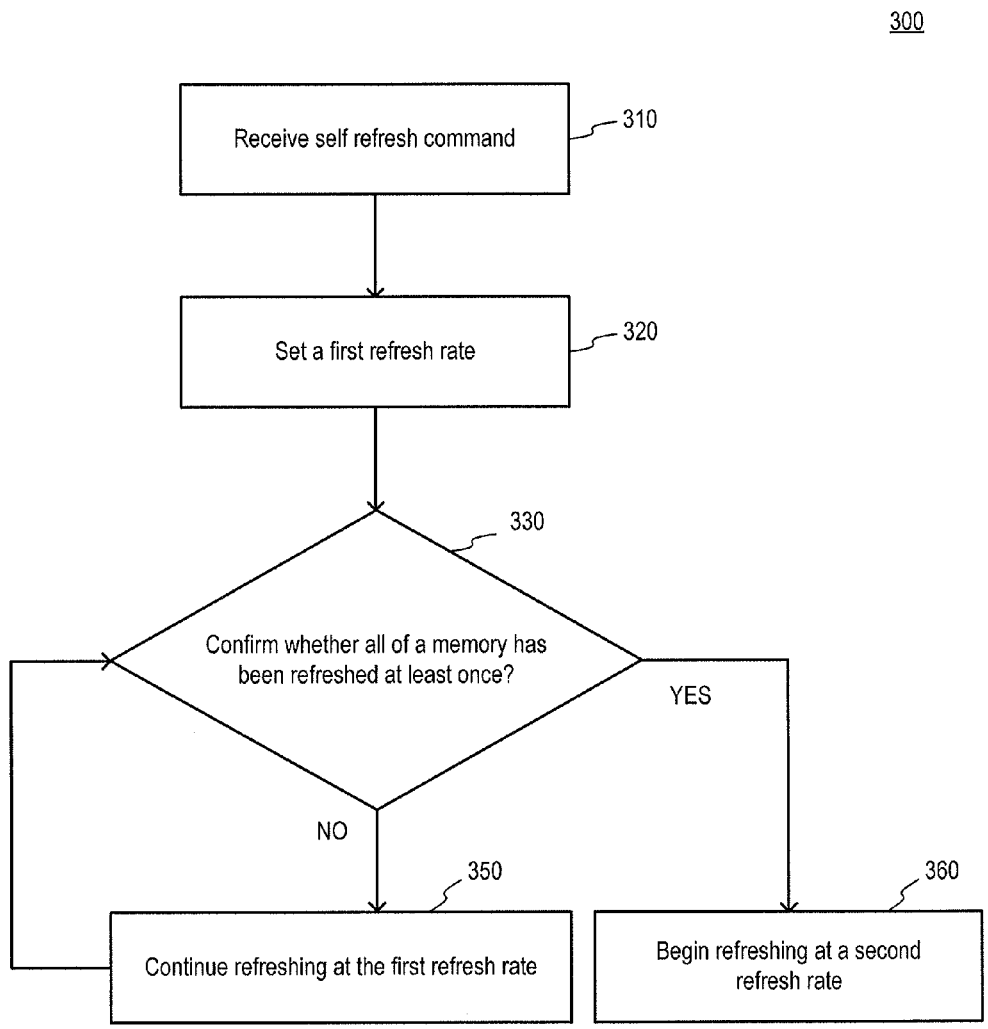
FIG. 3 is a flow diagram of a particular illustrative embodiment of a method of refreshing a memory.

Referring to FIG. 3, a flow diagram of a particular illustrative embodiment of a method of refreshing a memory is designated 300. The method 300 may be performed by the apparatus 100 of FIG. 1 and/or the apparatus 200 of FIG. 2.

The method 300 may include receiving a self refresh command at a memory, at step 310. The self refresh command may be received at a self refresh mode controller, such as the self refresh mode controller 110 of FIG. 1 or the self refresh mode controller 210 of FIG. 2. The self refresh command may be provided (e.g., sent from) an external controller. A clock enable signal having a de-asserted value may also be received at the memory with the self refresh command.

The method 300 may further include setting a first refresh rate, at step 320. The first refresh rate may be a normal refresh rate increased by a multiplier.

The method 300 may further include confirming whether all of the memory has been refreshed at least once, at 330. Confirming whether all of the memory has been refreshed at least once may include storing or resetting a count and/or activating a timer, and beginning to refresh the memory at the first refresh rate. The counter may be the counter 130 of FIG. 1. As explained with reference to FIG. 1, a count of the counter may be stored responsive to receipt of the self refresh command. In another embodiment, additional (e.g., overflow) bits may be reset in response to receiving the self refresh command. The timer may be the timer 240 of FIG. 2. As explained with reference to FIG. 2, the timer may be activated responsive to receipt of the self refresh command. Confirming that all of the memory has been refreshed once may include determining whether a refresh counter has completed at least one refresh cycle or a time period has expired. In an embodiment, the method includes comparing a stored initial count with a current count provided by the refresh counter at each iteration. In another embodiment, the method includes monitoring a value of an additional bit(s) of the refresh count to detect transition to a logical one value. In yet another embodiment, the method includes monitoring a timer for expiration of a time period. The method 300 may further include continuing the self refresh at the first refresh rate responsive to a lack of confirmation that all of the memory has been refreshed at least once, at 350.

The method 300 may further includes performing the self refresh at a second refresh rate responsive to confirmation that all of the memory has been refreshed at least once. The second refresh rate may be the normal self refresh rate. In an embodiment, the second refresh rate is less than the first refresh rate. For example, the first refresh rate may be twice as great as the first refresh rate.

Figure 4:
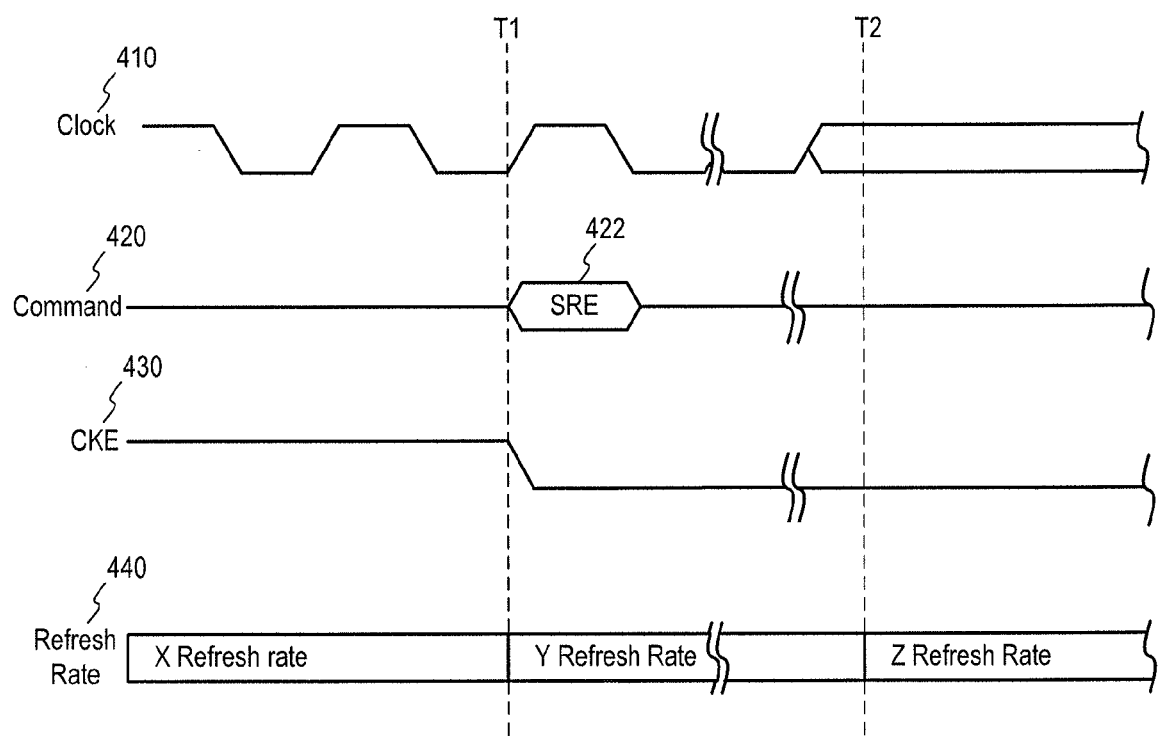
FIG. 4 is an exemplary timing diagram of a particular illustrative embodiment of a memory refresh.

Referring to FIG. 4, an exemplary timing diagram of a particular illustrative embodiment of a memory refresh is disclosed and generally designated 400. For example, the exemplary timing diagram 400 may illustrate timing characteristics of the apparatus 100 of FIG. 1, the apparatus 200 of FIG. 2, and/or the method 300 of FIG. 3. The timing diagram 400 depicts an externally controlled refresh prior to time T1 and an internally controlled self refresh after time T1.

The self refresh includes a first self refresh time period starting at a time T1 and ending at a time T2 and a second self refresh time period starting at the time T2. The timing diagram 400 depicts a clock signal 410, a command signal 420, a clock enable (CKE) signal 430, and a refresh rate 440 represented over time. The clock signal 410, the command signal 420, the clock enable (CKE) signal 430 may be provided by an external controller. The refresh rate 440 may be set by the external controller during the external refresh (e.g., prior to time T1), and may be set by the memory during the self refresh (e.g., after time T1).

Prior to time T1, the timing diagram 400 illustrates a refresh controlled by an external controller. The refresh rate 440 prior to T1 is X refresh rate. The CKE signal 430 is asserted and the clock 410 is provided to the memory. Further, the command signals 420 may represent refresh commands (not shown).

At time T1, the external controller de-asserts the CKE signal 430 and provides (e.g., transmits) the self refresh (SRE) command 422. In response to receipt of the SRE command, the memory begins performing self refresh at a Y refresh rate. The Y refresh rate may be greater than the X refresh rate. The memory may continue refreshing at the Y refresh rate during the first time period in self refresh from time T1 until time T2. During the first time period, the memory is refreshed at the Y refresh rate until all of the memory has been refreshed at least once following the SRE command. The length of the first time period may be controlled by a counter, as explained with reference to FIG. 1 or a timer, as explained with regards to FIG. 2.

At time T2, the refresh rate 440 may switch to a Z refresh rate and the memory may be refreshed at the Z refresh rate during the second time period. The Z refresh rate may be slower than the Y refresh rate of the first time period. Thus, during the first time period, the memory is refreshed at a refresh rate that is faster than the refresh rate during the second time period. The switch to the Z refresh rate at time T2 may be controlled, for example, by the counter completing at least one refresh cycle or a time period expiring. The memory may continue to be refreshed at the Z refresh rate until self refresh mode is exited.

Figure 5:
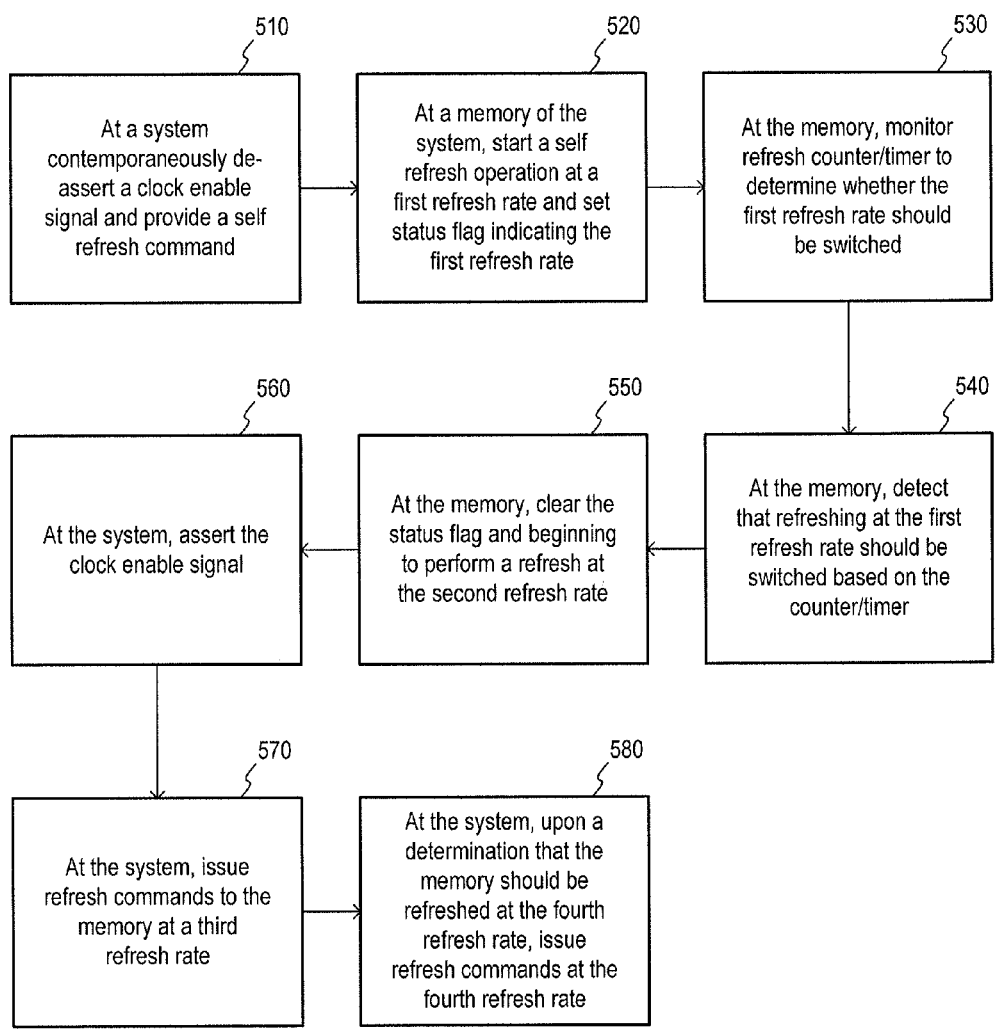
FIG. 5 is a flow diagram of a particular illustrative embodiment of a method of refreshing a memory.

Referring to FIG. 5, a flow diagram of a particular illustrative embodiment of a method of refreshing a memory is designated 500. The method 500 may be performed by the apparatus 100 of FIG. 1 and/or the apparatus 200 of FIG. 2.

The method 500 may include at a system, contemporaneously deasserting a clock enable signal, and providing a self refresh command, at step 510. The system may include an external controller and a memory. The self refresh command may be provided by (e.g., sent from) the external controller to the memory. The self refresh command may be received at a self refresh mode controller of the memory, such as the self refresh mode controller 110 of FIG. 1 or the self refresh mode controller 210 of FIG. 2.

The method 500 may further include, at a memory of the system, starting a self refresh operation at a first refresh rate and setting a status flag indicating the first refresh rate, at step 520. As explained with reference to FIGS. 1 and 2, the first refresh rate may be an increased refresh rate compared to a second refresh rate at which the memory is refreshed later in the self refresh operation. For example, the first refresh rate may be the second refresh rate with a multiplier applied. The status flag may be used to selectively control an oscillator of the self refresh mode controller to provide refresh commands at a particular rate. For example, the status flag being set may control the oscillator to have the self refresh mode controller provide refresh commands at the first (e.g., increased) refresh rate.

The method 500 may further include, at the memory, monitoring a refresh counter or timer to determine whether the first refresh rate should be switched, at step 530. As explained with reference to FIG. 1, an initial count may be stored responsive to receipt of the self refresh command, and the memory may monitor each provided count to determine when each memory address has been refreshed at least once. In another embodiment, additional counter bits may be monitored to determine when each memory address has been refreshed at least once. The timer may be the timer 240 of FIG. 2. As explained with reference to FIG. 2, the time may be activated responsive to receipt of the self refresh command, and monitored for expiration of a time period.

The method 500 may further include, at the memory, determining (e.g., detecting) that refreshing at the first refresh rate should be switched responsive the counter or timer, at step

540. For example, responsive to a current count matching a stored initial count, the memory may determine that the memory should switch from refreshing at the first refresh rate to refreshing at a second refresh rate. In another example, the memory may determine that the memory should switch from refreshing at the first refresh rate to refreshing at a second refresh rate responsive to one or more additional count bits being set to a one. In yet another example, the memory may determine that the memory should switch from refreshing at the first refresh rate to refreshing at a second refresh responsive to expiration of the time period.

The method 500 further includes, at the memory, clearing the status flag and beginning to perform refresh at the second (e.g., normal) refresh rate, at step 550. The status flag being cleared may control the oscillator to have the self refresh mode controller provide refresh commands at the second refresh rate. The memory may continue to be refreshed at the second refresh rate as long as the memory is in self refresh.

The method 500 may include at a system, asserting the clock enable signal, at step 560. Asserting the clock enable signal may cause the memory to exit self refresh, and enter an externally controlled refresh mode.

The method 500 may further include, at the system, providing refresh commands to the memory at a third refresh rate, at step 570. The third refresh rate in some embodiments may be the same as the first refresh rate. The external controller may control the refresh.

The method 500 may further include, at the system, responsive to (e.g., upon, when based on, etc.) a determination that the memory should be refreshed at a fourth refresh rate, provide refresh commands at the fourth refresh rate, at step 580. The fourth refresh rate in some embodiments be the same as the second refresh rate.

Figure 6:
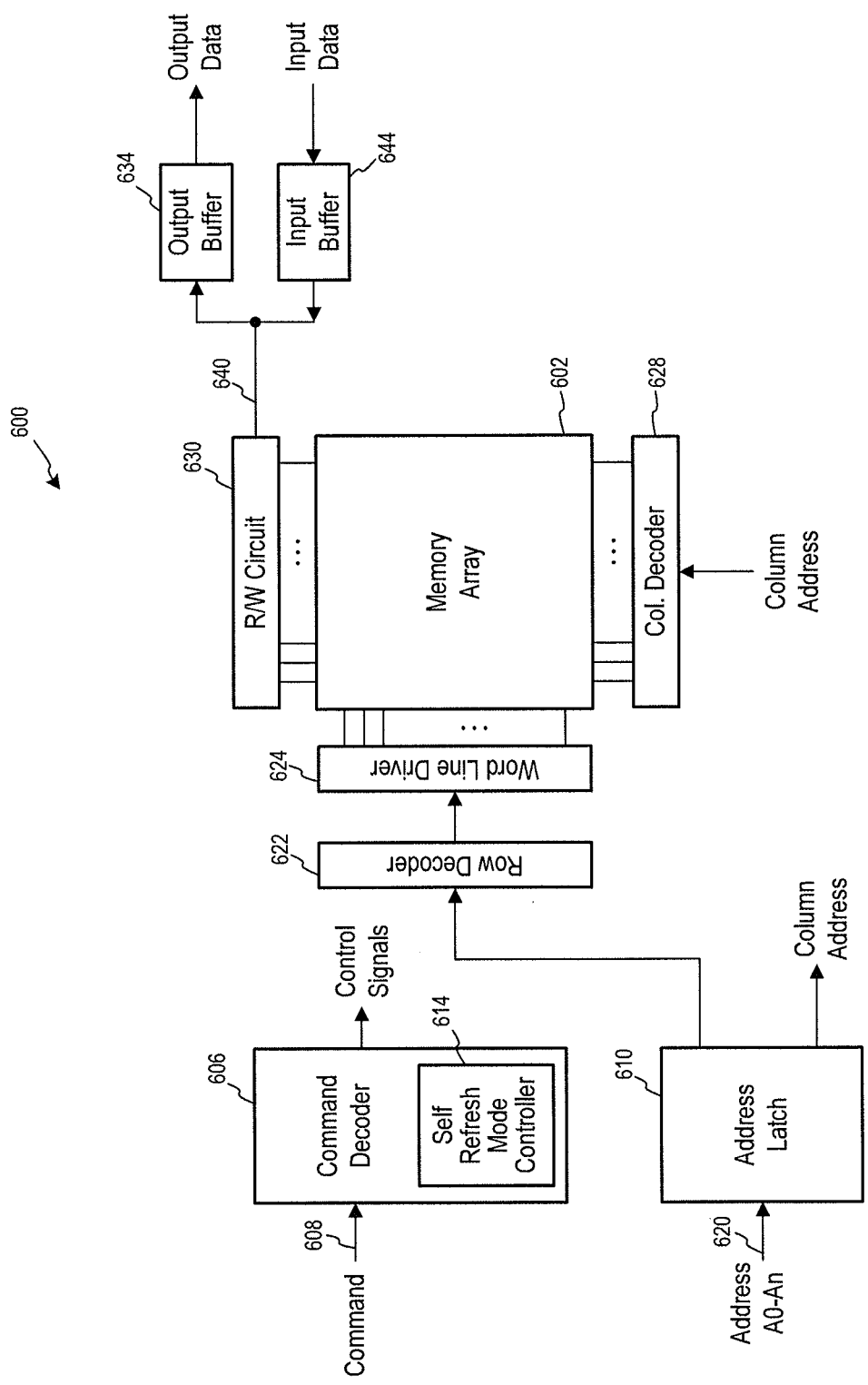
FIG. 6 is a block diagram of a memory including a self refresh mode controller according to an embodiment of the invention.

Referring to FIG. 6, block diagram of a memory 600 including a self refresh mode controller. The a memory 600 may include an array 602 of memory cells, which may be, for example, dynamic random-access memory (DRAM) memory cells, static random-access memory (SRAM) memory cells, flash memory cells, or some other types of memory cells. The memory 600 includes a command decoder 606 that may receive memory commands through a command bus 608 and provide (e.g., generate) corresponding control signals within the memory 600 to carry out various memory operations. Row and column address signals may be provided (e.g., applied) to an address latch 610 in the memory 600 through an address bus 620. The address latch 610 may then provide (e.g., output) a separate column address and a separate row address.

The address latch 610 may provide row and column addresses to a row address decoder 622 and a column address decoder 628, respectively. The column address decoder 628 may select bit lines extending through the array 602 corresponding to respective column addresses. The row address decoder 622 may be connected to a word line driver 624 that activates respective rows of memory cells in the array 602 corresponding to received row addresses. The selected data line (e.g., a bit line or bit lines) corresponding to a received column address may be coupled to a read/write circuitry 630 to provide read data to a data output buffer 634 via an input-output data bus 640. Write data may be provided to the memory array 602 through a data input buffer 644 and the memory array read/write circuitry 630. The command decoder 606 may respond to memory commands provided to the command bus 608 to perform various operations on the memory array 602. In particular, the command decoder 606 may be used to provide internal control signals to read data from and write data to the memory array 602.

The command decoder 606 of the memory 600 may include a self refresh mode controller 614. The self refresh mode controller 614 may include the self refresh mode controller 110 of FIG. 1 and/or the self refresh mode controller 210 of FIG. 2, and may be capable of performing the method 300 of FIG. 3. For example, the self refresh mode controller 614 may be configured to perform a self refresh operation according to one of the embodiments described above or some other embodiment. The self refresh mode controller 614 may be configured to provide memory commands to refresh the memory at a first refresh rate after receiving a self refresh command, and provide memory commands to refresh the memory at a second refresh rate based on a determination that each memory cell in the array 602 of memory cells has been refreshed at least once at the first refresh rate. In another embodiment, the self refresh mode controller 614 is separate from the command decoder 606

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method, comprising:
   receiving a self refresh command at a memory;
   initializing a count provided by a counter responsive to receipt of the self refresh command;
   refreshing the memory at a first refresh rate in response to receiving the self refresh command by changing the count provided by the counter, wherein the count corresponds to an address of memory cells of the memory, wherein refreshing progresses through the memory as the count changes;
   determining that the memory has been refreshed at the first refresh rate in response to the count provided by the counter; and
   refreshing the memory at a second refresh rate in response to a determination that the memory has been refreshed at the first refresh rate, wherein the first refresh rate is greater than a second refresh rate.

2. The method of claim 1, wherein initializing the count comprises storing an initial count of the counter and wherein determining that each memory cell of the memory has been refreshed at the first refresh rate comprises comparing the initial count with a current count provided by the counter to detect a match.

3. The method of claim 1, wherein initializing the count comprises resetting a bit of the count, and wherein determining that the memory has been refreshed at the first refresh rate comprises detecting that the bit has a particular value.

4. The method of claim 3, wherein detecting that the bit has a particular value comprises detecting that a most significant bit of the count has the particular value.

5. The method of claim 1, further comprising determining that the memory has been refreshed at the first refresh rate in response to a timer.

6. The method of claim 5, further comprising:
activating the timer in response to receiving the self refresh command; to being a time period.

7. The method of claim 6, wherein determining that the memory has been refreshed at the first refresh rate comprises detecting that the time period has expired.

8. The method of claim 5, wherein determining that the memory has been refreshed at the first refresh rate in response to a timer comprises detecting that a time period has expired.

9. A method, comprising:
receiving a self refresh command and a clock enable signal at a memory;
initializing a count responsive to receiving the self refresh command;
refreshing the memory at a first refresh rate responsive to receiving the self refresh command;
changing a count provided by the counter corresponding to each iterative refresh of the memory; and
refreshing the memory at a second refresh rate in response to the count indicating that the memory has been refreshed at the first refresh rate.

10. The method of claim 9, wherein receiving the clock enable signal further comprises the clock enable signal having a de-asserted value contemporaneously with receipt of the self refresh command.

11. The method of claim 9, wherein the first refresh rate is greater than the second refresh rate.

12. The method of claim 11, wherein the first refresh rate is twice as great as the second refresh rate.

13. An apparatus comprising:
a self refresh mode controller comprising:
self refresh mode controller logic configured to receive a self refresh command and is further configured to receive a clock enable signal, the self refresh mode controller further configured to, in response to receipt of the self refresh command, provide refresh commands to memory cells of a memory to be refreshed at a first refresh rate during a first time period in which self refresh is enabled to cause the memory cells to be refreshed, and further configured to provide refresh commands at a second refresh rate during a second time period in which the self refresh is enabled, wherein the second time period starts at an end of the first time period and ends in response to the clock enable signal having an asserted value.

14. The apparatus of claim 13, wherein the self refresh mode controller further comprises a counter configured to provide a refresh address count, wherein the first time period begins in response to receipt of the self refresh command and ends responsive to the refresh address count reaching a particular value.

15. The apparatus of claim 13, wherein the self refresh mode controller further comprises a timer, wherein the self refresh logic activates the timer in response to receipt of the self refresh command, wherein the first time period begins in response receipt of the self refresh command and ends in response to an indication that the timer has expired.

16. An apparatus comprising:
a memory array; and
self refresh mode controller configured to receive a self refresh command, and configured to, in response to receipt of the self refresh command, provide refresh commands to the memory array at a first refresh rate, the self refresh mode controller further configured to provide refresh commands to the memory at a second refresh rate in response to a determination that all of the memory array has been refreshed at the first refresh rate.

17. The apparatus of claim 16, wherein the self refresh mode controller further comprises a counter, wherein the determination that the memory array has been refreshed at the first refresh rate is in response to a count provided by the counter.

18. The apparatus of claim 17, wherein the self refresh mode controller is further configured to initialize the count responsive to receiving the self refresh command and to change a count provided by the counter corresponding to providing each of the refresh commands at the first refresh rate.

19. The apparatus of claim 16, wherein the self refresh mode controller further comprises a timer, wherein the determination that the memory array has been refreshed at the first refresh rate is in response to an indication that a time period has expired.

20. The apparatus of claim 16, wherein the first refresh rate is based on a multiplier applied to the second refresh rate.

21. The apparatus of claim 20, wherein the multiplier is selectable.

* * * * *